United States Patent
Kim et al.

(10) Patent No.: US 10,563,092 B2
(45) Date of Patent: *Feb. 18, 2020

(54) COMPOSITION FOR WINDOW FILM, FLEXIBLE WINDOW FILM FORMED THEREFROM, AND FLEXIBLE DISPLAY DEVICE COMPRISING SAME

(71) Applicants: SAMSUNG SDI CO., LTD., Yongin-si, Gyeonggi-do (KR); SAMSUNG ELECTRONICS CO., LTD., Suwon-si, Gyeonggi-do (KR)

(72) Inventors: Min Hye Kim, Suwon-si (KR); Kyoung Ku Kang, Suwon-si (KR); Ji Hwan Park, Suwon-si (KR); Chang Soo Woo, Suwon-si (KR); Ji Sun Im, Suwon-si (KR); Seung Woo Jang, Suwon-si (KR); Dong Il Han, Suwon-si (KR)

(73) Assignees: Samsung SDI Co., Ltd., Yongin-si (KR); Samsung Electronics Co., Ltd., Suwon-si (KR)

( * ) Notice: Subject to any disclaimer, the term of this patent is extended or adjusted under 35 U.S.C. 154(b) by 67 days.

This patent is subject to a terminal disclaimer.

(21) Appl. No.: 15/745,699

(22) PCT Filed: Jul. 22, 2016

(86) PCT No.: PCT/KR2016/008015
§ 371 (c)(1),
(2) Date: Jan. 17, 2018

(87) PCT Pub. No.: WO2017/022987
PCT Pub. Date: Feb. 9, 2017

(65) Prior Publication Data
US 2018/0215948 A1  Aug. 2, 2018

(30) Foreign Application Priority Data

Aug. 3, 2015 (KR) .................. 10-2015-0109757

(51) Int. Cl.
| | | |
|---|---|---|
| *C09D 183/06* | (2006.01) | |
| *G06F 3/041* | (2006.01) | |
| *G02B 1/14* | (2015.01) | |
| *C09J 7/29* | (2018.01) | |
| *C08J 7/04* | (2020.01) | |
| *H01L 51/52* | (2006.01) | |
| *H01L 27/32* | (2006.01) | |
| *H01L 51/00* | (2006.01) | |

(52) U.S. Cl.
CPC ............ *C09D 183/06* (2013.01); *C08J 7/047* (2013.01); *C09J 7/29* (2018.01); *G02B 1/14* (2015.01); *G06F 3/041* (2013.01); *H01L 51/5253* (2013.01); *C08J 2379/08* (2013.01); *C08J 2483/06* (2013.01); *C09J 2479/086* (2013.01); *C09J 2483/006* (2013.01); *G06F 2203/04102* (2013.01); *H01L 27/323* (2013.01); *H01L 27/3244* (2013.01); *H01L 51/0097* (2013.01); *H01L 51/5281* (2013.01); *H01L 2251/5338* (2013.01); *H01L 2251/558* (2013.01)

(58) Field of Classification Search
CPC ...... C09D 183/06; C09D 183/14; G02B 1/14; C09J 7/29; C09J 7/047; C09J 2203/318; C09J 2201/162; C09J 2479/086; C09J 2483/006; C09J 2379/08; C09J 2483/06; H01L 51/0097; H01L 51/5253; H01L 51/5281; H01L 27/323; H01L 27/3244; H01L 2251/5338; H01L 2251/558; G06F 3/041; G06F 2203/04102; C08G 77/14; C08G 77/46
See application file for complete search history.

(56) References Cited

U.S. PATENT DOCUMENTS

| | | | |
|---|---|---|---|
| 5,280,098 A | 1/1994 | Witucki et al. | |
| 5,516,858 A * | 5/1996 | Morita | ............... C08G 59/3254 525/476 |
| 5,891,969 A * | 4/1999 | Mine | .................... C08G 59/306 257/E23.12 |
| 6,210,790 B1 | 4/2001 | Crivello | |
| 2008/0113188 A1 | 5/2008 | Shah et al. | |
| 2015/0207102 A1* | 7/2015 | Jeong | .................. H01L 51/5256 257/40 |
| 2016/0102226 A1* | 4/2016 | Alvarez | ................ C07F 7/0812 428/447 |

FOREIGN PATENT DOCUMENTS

| | | |
|---|---|---|
| JP | 2000-328000 A | 11/2000 |
| JP | 2007-176542 A | 7/2007 |
| KR | 10-2011-0118144 A | 10/2011 |

(Continued)

OTHER PUBLICATIONS

International Search Report for corresponding International application No. PCT/KR2016/008015, dated Oct. 20, 2016, including Eng. trans. 5pp.

(Continued)

*Primary Examiner* — Robert S Jones
(74) *Attorney, Agent, or Firm* — Lewis Roca Rothgerber Christie LLP

(57) ABSTRACT

Provided are: a composition for a window film, containing a siloxane resin including chemical formula 1, a crosslinking agent, and an initiator; a flexible window film formed therefrom; and a flexible display device including the same.

13 Claims, 3 Drawing Sheets

(56) References Cited

FOREIGN PATENT DOCUMENTS

| KR | 10-2011-0122820 A | 11/2011 |
|---|---|---|
| KR | 10-2012-0021721 A | 3/2012 |
| KR | 10-2014-0004568 A | 1/2014 |
| KR | 10-2014-0104175 A | 8/2014 |
| KR | 10-2015-0068240 A | 6/2015 |
| KR | 10-2015-0088101 A | 7/2015 |
| KR | 10-1845081 | 4/2018 |
| WO | WO 2014/186514 A1 | 11/2014 |

OTHER PUBLICATIONS

Written Opinion for corresponding International application No. PCT/KR2016/008015, dated Oct. 20, 2016, 6pp.
KR Office action for corresponding Korean Patent Application No. 10-2015-0109757, dated Jul. 30, 2018, 2 pages.
English Translation of Written Opinion for corresponding International application No. PCT/KR2016/008015, dated Oct. 20, 2016, 8 pages.
English translation of International Search Report for corresponding International Application PCT/KR2016/004226, dated Jul. 20, 2016 (2 pgs).
English translation of Written Opinion dated Jul. 21, 2016 for corresponding International Application PCT/KR2016/004226, 5pp.
English translation of International Preliminary Report on Patentability for corresponding International Application No. PCT/KR2016/004226, dated Oct. 31, 2017 (6 pgs.).
Korean Office action in corresponding Korean Application No. 10-2015-0062125, Korean Office action dated Jun. 29, 2018 (2 pgs.).

* cited by examiner

[FIG. 1]
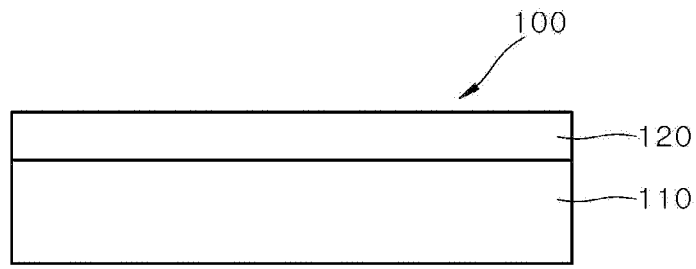
[FIG. 2]
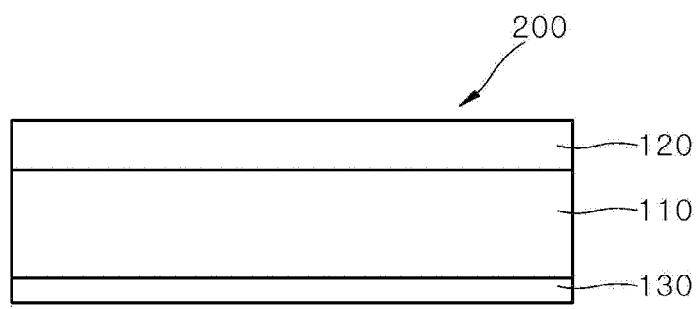
[FIG. 3]
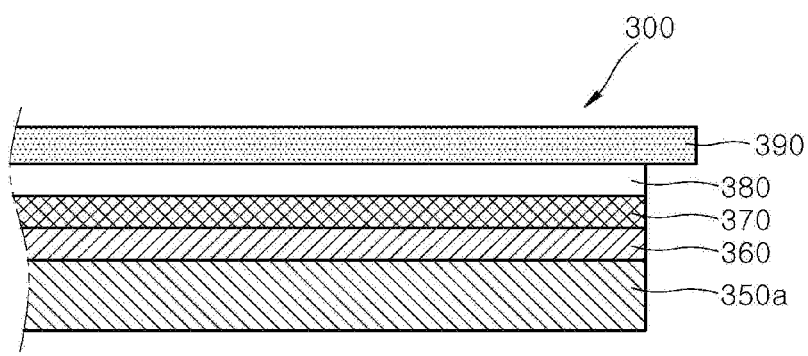

【FIG. 4】
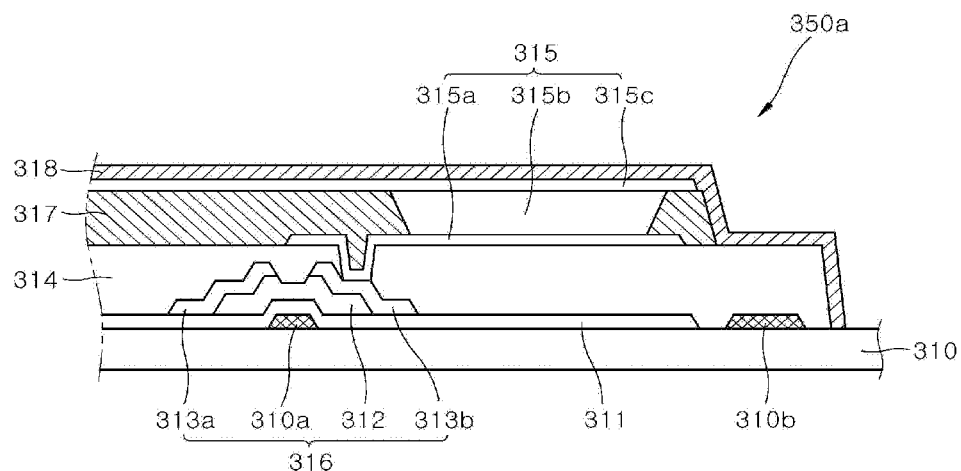
【FIG. 5】
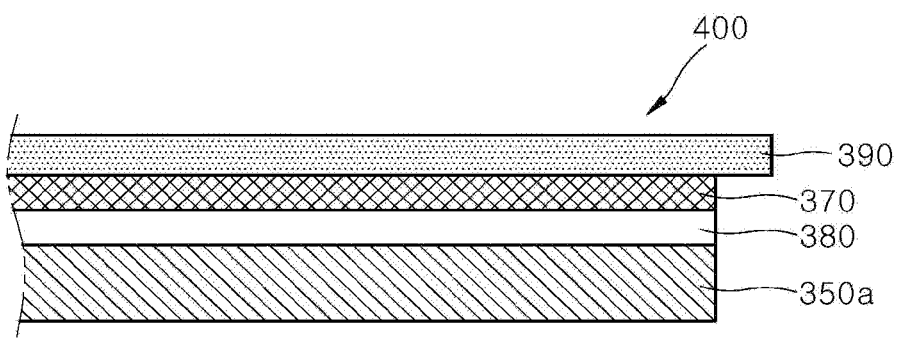
【FIG. 6】
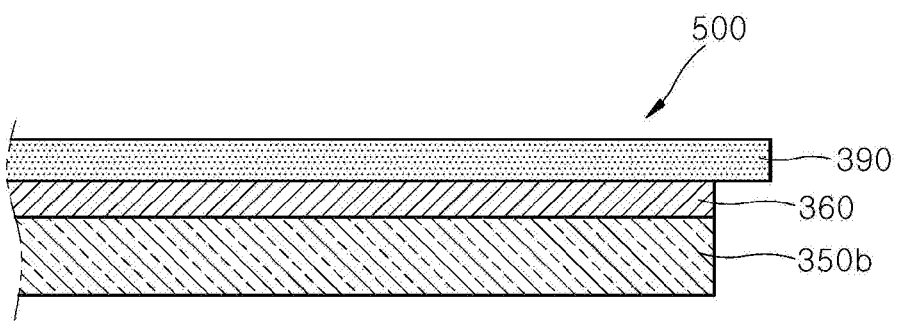

[FIG. 7]
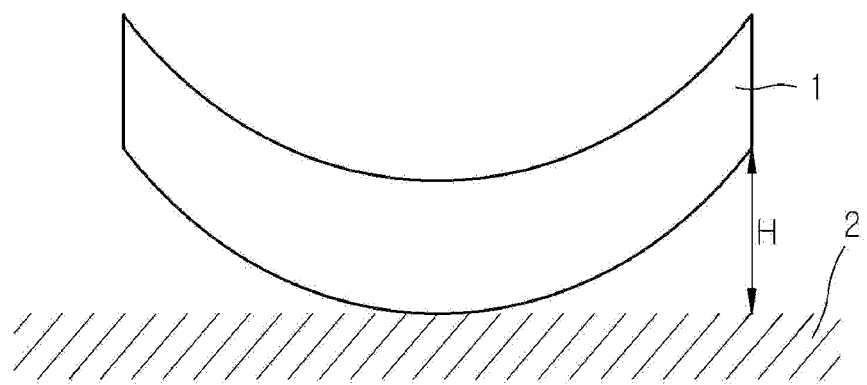

COMPOSITION FOR WINDOW FILM, FLEXIBLE WINDOW FILM FORMED THEREFROM, AND FLEXIBLE DISPLAY DEVICE COMPRISING SAME

CROSS-REFERENCE TO RELATED APPLICATIONS

This Application is a National Phase Patent Application and claims priority to and the benefit of International Application Number PCT/KR2016/008015, filed on Jul. 22, 2016, which claims priority to and the benefit of Korean Patent Application No. 10-2015-0109757, filed on Aug. 3, 2015, the entire contents of each of which are incorporated herein by reference.

BACKGROUND

1. Field

The present invention relates to a composition for window films, a flexible window film formed therefrom, and a flexible display including the same.

2. Description of the Related Art

Recently, with the replacement of a glass substrate or a high hardness substrate with a film in a display, a flexible display capable of being folded or unfolded has been developed in the related art. The flexible display is thin and light, has high impact resistance, can be folded and unfolded, and thus can be manufactured in various shapes.

In such a flexible display, not only a substrate but also various elements are required to have flexibility. Particularly, since a window film is disposed at the outermost side of the display, it is necessary for the window film to have flexibility and high hardness. Further, since the window film is manufactured by curing a composition for window films coated on a base layer, the window film can suffer from curling.

The background technique of the present invention is disclosed in Japanese Unexamined Patent Publication No. 2007-176542.

SUMMARY

It is one aspect of the present invention to provide a composition for window films that can realize a flexible window film having good properties in terms of hardness, flexibility and external appearance.

It is another aspect of the present invention to provide a composition for window films that can realize a flexible window film capable of suppressing generation of curl.

It is a further aspect of the present invention to provide a flexible window film, which has good properties in terms of hardness, flexibility and external appearance and is capable of suppressing generation of curl, and a flexible display including the same.

In accordance with one aspect of the present invention, a composition for window films includes: a siloxane resin including a compound represented by Formula 1; a cross-linking agent; and an initiator:

<Formula 1>

(where in Formula 1, $R^1$, $R^2$, $R^3$, x and y are the same as defined in the following detailed description of the invention).

In accordance with another aspect of the present invention, a flexible window film includes: a base layer; and a coating layer formed on the base layer, wherein the coating layer is formed of the composition for window films as set forth above.

In accordance with a further aspect of the present invention, a flexible display includes the flexible window film as set forth above.

The present invention provides a composition for window films that can realize a flexible window film having good properties in terms of hardness, flexibility and external appearance.

The present invention provides a composition for window films that can realize a flexible window film capable of suppressing generation of curl.

The present invention provides a flexible window film, which has good properties in terms of hardness, flexibility and external appearance and is capable of suppressing generation of curl, and a flexible display including the same.

BRIEF DESCRIPTION OF DRAWINGS

FIG. 1 is a sectional view of a flexible window film according to one embodiment of the present invention.

FIG. 2 is a sectional view of a flexible window film according to another embodiment of the present invention.

FIG. 3 is a sectional view of a flexible display according to one embodiment of the present invention.

FIG. 4 is a sectional view of one embodiment of a display part shown in FIG. 3.

FIG. 5 is a sectional view of a flexible display according to another embodiment of the present invention.

FIG. 6 is a sectional view of a flexible display according to a further embodiment of the present invention.

FIG. 7 is a diagram illustrating a method of measuring curl.

DETAILED DESCRIPTION

Embodiments of the present invention will be described in detail with reference to the accompanying drawings. It should be understood that the present invention is not limited to the following embodiments and may be embodied in different ways. In the drawings, portions irrelevant to the description will be omitted for clarity. Like components will be denoted by like reference numerals throughout the specification.

Herein, spatially relative terms such as "upper" and "lower" are defined with reference to the drawings. Thus, it will be understood that the term "upper surface" can be used interchangeably with the term "lower surface". In addition, when an element such as a layer or a film is referred to as being placed "on" another element, it can be directly placed on the other element or intervening element(s) may be present. On the other hand, when an element is referred to as being placed "directly on" another element, there are no intervening element(s) therebetween.

Herein, "pencil hardness" is measured on a coating layer of a window film using a pencil hardness tester (Heidon) in accordance with JIS K5400. In measurement of pencil hardness, pencils of 6B to 9H (Mitsubishi Co., Ltd.) are used. Specifically, pencil hardness is measured under conditions of a pencil load of 1 kg on the coating layer, a scratch angle of 45°, and a scratch speed of 60 mm/min. When the coating layer has one or more scratches after being tested 5 times using a certain pencil, pencil hardness is measured again using another pencil having one-level lower pencil hardness than the previous pencil, and the maximum value of pencil hardness allowing no scratch to be observed all five times on the coating layer is taken as pencil hardness of the coating layer.

Herein, "radius of curvature" means a minimum radius of a jig causing no cracks on a window film specimen when the window film specimen is wound around the jig for measuring radius of curvature (CFT-200R, Covotech Co., Ltd.), kept wound for 5 seconds, unwound, and then observed with the naked eye to determine whether the specimen has cracks. Here, a radius of curvature in a compression direction is measured when the specimen is wound around the jig such that a window coating layer of the window film contacts a surface of the jig, and a radius of curvature in a tensile direction is measured when the specimen is wound around the jig such that a base layer of the window film contacts the jig.

Herein, referring to FIG. 7, "curl" means a maximum height H from a floor surface 2 to edge of a window film 1 placed on the floor 2, as measured after the window film 1 is left under conditions of 25° C. and 40% relative humidity (RH), in which the maximum height was measured three times and averaged.

Herein, the term "epoxy group" in "$R^1$" means an alicyclic epoxy group-containing functional group or a glycidyl group-containing functional group.

Herein, the term "alicyclic epoxy group" means an epoxidized $C_5$ to $C_{20}$ cycloalkyl group. For example, the alicyclic epoxy group may be an epoxy cyclohexyl group. Herein, the term "alicyclic epoxy group-containing functional group" means an alicyclic epoxy group-containing substituted or unsubstituted $C_1$ to $C_{20}$ alkyl group, substituted or unsubstituted $C_5$ to $C_{20}$ cycloalkyl group, or substituted or unsubstituted $C_6$ to $C_{20}$ aryl group. For example, the alicyclic epoxy group-containing functional group may be an epoxycyclohexylethyl group.

Herein, the term "glycidyl group-containing functional group" means a glycidoxy group, glycidyl group or glycidoxy group-containing substituted or unsubstituted $C_1$ to $C_{20}$ alkyl group, a glycidyl group or glycidoxy group-containing substituted or unsubstituted $C_5$ to $C_{20}$ cycloalkyl group, or a glycidyl group or glycidoxy group-containing substituted or unsubstituted $C_6$ to $C_{20}$ aryl group.

Herein, unless otherwise stated, "substituted" means that at least one hydrogen atom in a functional group is substituted with a hydroxyl group, an unsubstituted $C_1$ to $C_{10}$ alkyl group, a $C_1$ to $C_{10}$ alkoxy group, a $C_3$ to $C_{10}$ cycloalkyl group, an unsubstituted $C_6$ to $C_{20}$ aryl group, a $C_7$ to $C_{20}$ arylalkyl group, a benzophenone group, a $C_6$ to $C_{20}$ aryl group substituted with a $C_1$ to $C_{10}$ alkyl group, or a $C_1$ to $C_{10}$ alkyl group substituted with a $C_1$ to $C_{10}$ alkoxy group.

Herein, the term "(meth)acryl" refers to "acryl" and/or "methacryl".

Herein, "halogen" means fluorine, chlorine, bromine, or iodine.

Hereinafter, a composition for window films according to one embodiment of the present invention will be described.

The composition for window films according to the embodiment includes: a siloxane resin including a compound represented by Formula 1; a crosslinking agent; and an initiator.

  <Formula 1>

(where in Formula 1, $R^1$ is an epoxy group;
$R^2$ and $R^3$ are each independently a methyl group or an ethyl group; and
$0.75 \leq x < 1$, $0 < y \leq 0.25$, and $x+y=1$).

With the siloxane resin including greater than about 0 mol % to about 25 mol % or less of the compound represented by $(R^2R^3SiO_{2/2})$, the composition for window films according to the embodiment can improve hardness and flexibility of a window film formed of the composition, can prevent generation of creases to provide good external appearance, and can suppress generation of curl. Specifically, the siloxane resin may include greater than about 0 mol % to about 25 mol % or less of the compound represented by $(R^2R^3SiO_{2/2})$, specifically about 1 mol % to about 25 mol %, about 2 mol % to about 20 mol %, more specifically about 3 mol % to about 20 mol %. In addition, the siloxane resin including the compound represented by Formula 1 is prepared through adjusting the amount ratio of each of silicone monomers for $(R^1SiO_{3/2})$ and $(R^2R^3SiO_{2/2})$, thereby suppressing generation of curl of the window film and allowing easy adjustment of hardness and flexibility thereof.

In Formula 1, $R^1$ provides crosslinkability to the composition for window films while suppressing generation of curl of the window film. Specifically, $R^1$ may be an alicyclic epoxy group-containing functional group, more specifically, a (3,4-epoxycyclohexyl)methyl((3,4-epoxycyclohexyl)methyl) group or a (3,4-epoxycyclohexyl)ethyl((3,4-epoxycyclohexyl)ethyl) group, and can improve hardness and flexibility of the window film while suppressing generation of curl thereof. In Formula 1, $R^2$ and $R^3$ improve hardness and flexibility of the window film while suppressing generation of curl thereof, and can improve coatability of the composition to provide a good external appearance to the window film.

Specifically, in Formula 1, x may be about 0.75 to about 0.99 and y may be about 0.01 to about 0.25, more specifically x may be about 0.80 to about 0.98 and y may be about 0.02 to about 0.20, or x may be about 0.80 to about 0.97 and y may be about $0.03 \leq x \leq$ about 0.20. Within these ranges, the composition can secure good window film properties in terms of hardness, flexibility and external appearance while suppressing generation of curl.

Specifically, the siloxane resin including the compound represented by Formula 1 may include at least one of compounds represented by Formulae 1-1 to 1-3, without being limited thereto:

  <Formula 1-1>

  <Formula 1-2>

  <Formula 1-3>

(In Formula 1-1 to 1-3, Ec is a (3,4-epoxycyclohexyl)ethyl group, Me is a methyl group, Et is an ethyl group, $0.75 \leq x < 1$, $0 < y \leq 0.25$, and $x+y=1$).

The siloxane resin including the compound represented by Formula 1 may have a weight average molecular weight of about 5,000 to about 100,000, specifically about 5,000 to about 15,000. Within this range, the siloxane resin can be easily produced and can exhibit good properties in terms of hardness and flexibility. The siloxane resin including the compound represented by Formula 1 may have a polydispersity index (PDI) of about 1.0 to about 3.0, specifically about 1.5 to about 2.5. Within this range, the composition has good wettability and can secure stable coating properties. The siloxane resin including the compound represented by Formula 1 may have an epoxy equivalent weight of about 0.1 mol/100 g to about 1.0 mol/100 g, specifically about 0.3 mol/100 g to about 0.7 mol/100 g. Within this range, the siloxane resin can provide stable coating properties to the composition for window films while securing good hardness and flexibility of the window film.

The siloxane resin including the compound represented by Formula 1 may include at least one ($R^1SiO_{3/2}$) and at least one ($R^2R^3SiO_{2/2}$). The siloxane resin including the compound represented by Formula 1 may be used alone or as a mixture thereof in the composition for window films.

The siloxane resin including the compound represented by Formula 1 may be prepared through hydrolysis and condensation of a monomer mixture of a first silicone monomer and a second silicone monomer. In the monomer mixture, the first silicone monomer may be present in an amount of about 75 mol % to less than about 100 mol %, about 75 mol % to about 99 mol %, about 80 mol % to about 98 mol %, or about 80 mol % to about 97 mol %, and the second silicone monomer may be present in an amount of greater than about 0 mol % to about 25 mol % or less, about 1 mol % to about 25 mol %, about 2 mol % to about 20 mol %, or about 3 mol % to about 20 mol %. Within these ranges, the composition for window films can secure suitable hardness of the window film while improving flexibility of the window film.

The first silicone monomer may include a silane compound having the compound represented by $R^1$ of Formula 1. Specifically, the first silicone monomer may include compounds represented by Formula 2. These may be used alone or as a mixture thereof:

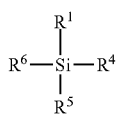
<Formula 2>

(where in Formula 2, $R^1$ is the same as defined in Formula 1; and $R^4$, $R^5$ and $R^6$ are each independently a halogen, a hydroxyl group or a $C_1$ to $C_{10}$ alkoxy group). More specifically, the first silicone monomer may include 2-(3,4-epoxycyclohexyl)ethyltriethoxysilane, 2-(3,4-epoxycyclohexyl)ethyltrimethoxysilane, and the like.

The second silicone monomer may include a silane compound having the compounds represented by $R^2$ and $R^3$ of Formula 1. Specifically, the second silicone monomer may include compounds represented by Formula 3. These may be used alone or as a mixture thereof.

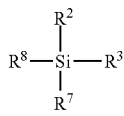
<Formula 3>

(where in Formula 3, $R^2$ and $R^3$ are the same as defined in Formula 1; and $R^7$ and $R^8$ are each independently a halogen, a hydroxyl group or a $C_1$ to $C_{10}$ alkoxy group). More specifically, the second silicone monomer may include dimethyldimethoxysilane, dimethyldiethoxysilane, diethylmethoxyethoxysilane, ethylmethyldimethoxysilane, and the like.

Hydrolysis and condensation of the monomer mixture may be performed by a typical method for preparation of a siloxane resin. Hydrolysis may include reacting the monomer mixture in a mixture of water and at least one of an acid and a base. Specifically, the acid may include acetic acid, formic acid, and the like, and the base may include NaOH, KOH, $K_2CO_3$, and the like. Hydrolysis may be performed at about 20° C. to about 100° C. for about 10 minutes to about 7 hours. Under these conditions, hydrolysis efficiency of the first and second silicone monomers can be improved. Condensation may be performed at about 20° C. to about 100° C. for about 10 minutes to about 12 hours under the same conditions as hydrolysis. Under these conditions, hydrolysis efficiency of the first and second silicone monomers can be improved.

The crosslinking agent containing a crosslinkable functional group can further improve hardness of the window film. The crosslinking agent may further include at least one of a non-cyclic aliphatic hydrocarbon group, a cyclic aliphatic hydrocarbon group, an aromatic hydrocarbon group, a hydrogenated aromatic hydrocarbon group, and an oxetane group in order to further improve flexibility of the window film.

Specifically, the crosslinking agent may include at least one of a non-cyclic aliphatic epoxy monomer, a cyclic aliphatic epoxy monomer, an aromatic epoxy monomer, a hydrogenated aromatic epoxy monomer, and an oxetane monomer. These crosslinking agents may be used alone or as a mixture thereof.

The non-cyclic aliphatic epoxy monomer may include 1,4-butanediol diglycidyl ether, 1,6-hexanediol diglycidyl ether, neopentyl glycol diglycidyl ether, trimethylolpropane triglycidyl ether, polyethyleneglycol diglycidyl ether, glycerin triglycidyl ether, and polypropyleneglycol diglycidyl ether; polyglycidyl ethers of polyetherpolyol obtained by adding one or more types of alkylene oxide to aliphatic polyhydric alcohols, such as ethylene glycol, propylene glycol, glycerin, and the like; diglycidyl esters of aliphatic long-chain dibasic acids; monoglycidyl ethers of higher aliphatic alcohols; glycidyl ethers of higher fatty acids; epoxylated soybean oil; epoxy stearic acid butyl; epoxy stearic acid octyl; epoxylated linseed oil; epoxylated polybutadiene, and the like.

The cyclic aliphatic epoxy monomer is a compound having at least one epoxy group in an alicyclic group. Specifically, the cyclic aliphatic epoxy monomer may include alicyclic epoxy carboxylate and alicyclic epoxy (meth)acrylate. More specifically, the cyclic aliphatic epoxy monomer may include 3,4-epoxycyclohexyl)methyl-3',4'-epoxycyclohexanecarboxylate, diglycidyl 1,2-cyclohexanedicarboxylate, 2-(3,4-epoxycyclohexyl-5,5-spiro-3, 4-epoxy)cyclohexane-meta-dioxane, bis(3,4-epoxycyclohexylmethyl)adipate, bis(3,4-epoxy-6-methylcyclohexylmethyl)adipate, 3,4-epoxy-6-methylcyclohexylmethyl-3',4'-epoxy-6'-methylcyclohexanecarboxylate, ε-caprolactone modified 3,4-epoxycyclohexylmethyl-3',4'-epoxy-cyclohexanecarboxylate, trimethylcaprolactone-modified 3,4-epoxycyclohexylmethyl-3',4'-epoxycyclohexanecarboxylate, β-methyl-δ-valerolactone modified 3,4-epoxycyclohexylmethyl-3',4'-epoxycyclohexanecarboxylate, 1,4-cyclohexanedimethanol bis(3,4-epoxycyclohexanecarboxylate, ethylene glycol di(3, 4-epoxycyclohexylmethyl)ether), ethylene bis(3,4-epoxycyclohexanecarboxylate), 3,4-epoxycyclohexylmethyl(meth) acrylate, bis(3,4-epoxycyclohexylmethyl)adipate, 4-vinylcyclohexen dioxide, vinylcyclohexene monoxide, and the like.

The aromatic epoxy monomer may include, for example, bisphenol type epoxy resins such as diglycidyl ether of bisphenol A, diglycidyl ether of bisphenol F, and diglycidyl ether of bisphenol S; novolac type epoxy resins such as a phenol novolac epoxy resin, a cresol novolac epoxy resin, and a hydroxybenzaldehyde phenol novolac epoxy resin; and polyfunctional epoxy resins such as glycidyl ether of tetra-hydroxyphenyl methane, glycidyl ether of tetrahydroxybenzophenone, and epoxylated polyvinyl phenol.

The hydrogenated aromatic epoxy monomer means a compound obtained by selective hydrogenation of an aromatic epoxy monomer in the presence of a catalyst under pressure. The aromatic epoxy monomer for the hydrogenated aromatic epoxy monomer may include the aromatic epoxy monomer described above.

The oxetane monomer may include at least one of 3-methyloxetane, 2-methyloxetane, 2-ethylhexyloxetane, 3-oxetanol, 2-methyleneoxetane, 3,3-oxetanedimethanethiol, 4-(3-methyloxetan-3-yl)benzonitrile, N-(2,2-dimethylpropyl)-3-methyl-3-oxetanmethaneamine, N-(1,2-dimethylbutyl)-3-methyl-3-oxetanmethaneamine, (3-ethyloxetan-3-yl)methyl (meth)acrylate, 4-[(3-ethyloxetan-3-yl)methoxy]butan-1-ol, 3-ethyl-3-hydroxymethyloxetane, xylenebisoxetane, and 3-[ethyl-3[[(3-ethyloxetane-3-yl]methoxy]methyl]oxetane, without being limited thereto.

Relative to 100 parts by weight of the siloxane resin including the compound represented by Formula 1, the crosslinking agent may be present in an amount of about 0.1 parts by weight to about 50 parts by weight, specifically about 1 part by weight to about 30 parts by weight, more specifically about 5 parts by weight to about 20 parts by weight. Within this range, the composition can secure improvement in flexibility and hardness of the window film.

The initiator can cure the siloxane resin including the compound represented by Formula 1 and the crosslinking agent. The initiator may include at least one of a photocationic initiator and a photo-radical initiator. These initiators may be used alone or as a mixture thereof.

As the photocationic initiator, any typical photocationic initiator known to those skilled in the art may be used. Specifically, the photocationic initiator may include at least one onium salt containing a cation and an anion. Specifically, the cation may include diaryliodonium such as diphenyliodonium, 4-methoxydiphenyliodonium, bis(4-methylphenyl)iodonium, bis(4-tert-butylphenyl)iodonium, bis(dodecylphenyl)iodonium, and (4-methylphenyl)[(4-(2-methylpropyl)phenyl)iodonium]; triarylsulfonium such as triphenylsulfonium, diphenyl-4-thiophenylphenylsulfonium, and diphenyl-4-thiophenoxyphenylsulfonium; bis[4-(diphenylsulfonio)phenyl]sulfide, and the like. Specifically, the anion may include hexafluorophosphate ($PF_6^-$), tetrafluoroborate ($BF_4^-$), hexafluoroantimonate ($SbF_6^-$), hexafluoroarsenate ($AsF_6^-$), hexachloroantimonate ($SbCl_6^-$), and the like.

As the photo-radical initiator, any photo-radical initiator known to those skilled in the art may be used. Specifically, the photo-radical initiator may include at least one of thioxanthone, phosphorus, triazine, acetophenone, benzophenone, benzoin, and oxime photo-radical initiators.

The initiator may be present in an amount of 0.01 parts by weight to 20 parts by weight, specifically 1 part by weight to 10 parts by weight, relative to 100 parts by weight of the siloxane resin including the compound represented by Formula 1. Within this range, the siloxane resin can be sufficiently cured without deterioration in transparency of the window film due to remaining initiator.

The composition for window films according to this embodiment may further include nanoparticles.

The nanoparticles can further improve hardness of the window film. The nanoparticles may include at least one of silica, aluminum oxide, zirconium oxide, and titanium oxide, without being limited thereto. The nanoparticles may also be subjected to surface treatment with a silicone compound for mixing with the siloxane resin. The nanoparticles are not limited to a particular shape or size. Specifically, the nanoparticles may include spherical, flake, or amorphous particles. The nanoparticles may have an average particle size of about 1 nm to about 200 nm, specifically about 10 nm to about 50 nm. Within this range, the nanoparticles can increase hardness of the window film without affecting surface roughness and transparency of the window film. The nanoparticles may be present in an amount of about 0.1 parts by weight to about 60 parts by weight, specifically about 10 parts by weight to about 50 parts by weight, relative to 100 parts by weight of the siloxane resin including the compound represented by Formula 1. Within this range, the nanoparticles can increase hardness of the window film without affecting surface roughness and transparency thereof.

The composition for window films according to this embodiment may further include additives. The additives can provide additional functions to the window film. The additives may be any additives commonly used for window films in the related art. Specifically, the additives may include at least one of a UV absorbent, a reaction inhibitor, an adhesion promoter, a thixotropic agent, a conductivity imparting agent, a color adjusting agent, a stabilizer, an antistatic agent, an antioxidant, and a leveling agent, without being limited thereto. The reaction inhibitor may include ethynylcyclohexane. The adhesion promoter may include an epoxy or alkoxysilane group-containing silane compound. The thixotropic agent may be fumed silica. The conductivity imparting agent may include metal powder such as silver powder, copper powder, aluminum powder, and the like, and the color adjusting agent may include pigments, dyes, and the like. The UV absorbent can improve light stability of the window film. The UV absorbent may be any typical absorbent known to those skilled in the art. Specifically, the UV absorbent may include at least one of triazine, benzimidazole, benzophenone, and benzotriazole UV absorbents, without being limited thereto. The additives may be present in an amount of about 0.01 parts by weight to about 5 parts by weight, specifically about 0.1 parts by weight to about 2.5 parts by weight, relative to 100 parts by weight of the siloxane resin including the compound represented by Formula 1. Within this range, the additives can improve hardness and flexibility of the window film while realizing effects thereof.

The composition for window films according to this embodiment may further include a solvent to improve coatability, wettability or processability. The solvent may include methylethylketone, methylisobutylketone, and propylene glycol monomethyl ether acetate, without being limited thereto.

The composition for window films according to this embodiment may have a viscosity of about 50 cP to about 2,000 cP at 25° C. Within this range, the composition allows easy formation of the window film.

Next, a flexible window film according to one embodiment will be described with reference to FIG. 1. FIG. 1 is a sectional view of a flexible window film according to one embodiment of the invention.

Referring to FIG. 1, a flexible window film 100 according to one embodiment of the invention may include a base layer 110 and a coating layer 120, in which the coating layer 120 may be formed of the composition for window films according to the embodiment of the present invention.

The base layer 110 can improve mechanical strength of the flexible window film 100 by supporting the coating layer 120 of the flexible window film 100. The base layer 110 may be attached to a display part, a touchscreen panel or a polarizing plate via an adhesive layer or the like.

The base layer 110 may be formed of an optically transparent flexible resin. For example, the resin may include polyester resins including polyethylene terephthalate, polyethylene naphthalate, polybutylene terephthalate, polybutylene naphthalate, and the like, polycarbonate resins, polyimide resins, polystyrene resins, poly(meth)acrylate resins including poly(methyl methacrylate), and the like. For the base layer 110, these resins may be used alone or as a mixture thereof.

The base layer 110 may have a thickness of about 10 μm to about 200 μm, specifically about 20 μm to about 150 μm, more specifically about 30 μm to about 100 μm. Within this thickness range, the base layer can be used in the flexible window film.

The coating layer 120 may be formed on the base layer 110 to protect the base layer 110, the display part, the touchscreen panel or the polarizing plate, and has high flexibility and high hardness to be used for a flexible display.

The coating layer 120 may have a thickness of about 5 μm to about 100 μm, specifically about 10 μm to about 80 μm, more specifically about 40 μm to about 60 μm Within this thickness range, the coating layer can be used in the flexible window film and secure good harness of the window film.

Although not shown in FIG. 1, functional surface layers such as an anti-reflection layer, an anti-glare layer, and a hard coating layer may be further formed on the other surface of the coating layer 120 to provide additional functions. In addition, although not shown in FIG. 1, the coating layer 120 may be further formed on the other surface of the base layer 110.

The flexible window film 100 is optically transparent and may be used in a transparent display. Specifically, the flexible window film 100 may have a transmittance of about 88% or more, specifically about 88% to 100%, in the visible range, specifically in a wavelength range of about 400 nm to about 800 nm. Within this range, the flexible window film can be used as a flexible window film.

The flexible window film 100 may have a pencil hardness of about 8H or higher, a radius of curvature of about 3.0 mm or less, and a curl of about 20 mm or less. Within these ranges, the flexible window film can suppress curling and has good hardness and flexibility to be used as a flexible window film. Specifically, the flexible window film 100 has a pencil hardness of about 8H to about 9H, a radius of curvature of about 0.1 mm to about 3 mm, and a curl of about 5 mm or less.

The flexible window film 100 may have a thickness of about 50 μm to about 300 μm. Within this range, the flexible window film can be used as a flexible window film.

The flexible window film 100 may be formed by coating and curing the composition for window films according to the embodiment of the invention on the base layer 110.

A method of coating the composition for window films onto the base layer 110 is not particularly limited. For example, the composition for window films may be coated onto the base layer by bar coating, spin coating, dip coating, roll coating, flow coating, or die coating. The composition for window films may be coated to a thickness of about 5 μm to about 100 μm on the base layer 110. Within this thickness range, a desired coating layer can be secured while providing good properties in terms of hardness, flexibility and reliability.

Curing is performed to form the coating layer by curing the composition for window films, and may include at least one of photocuring and heat curing. Photocuring may include irradiating the coated composition at a dose of about 10 mJ/cm$^2$ to about 1,000 mJ/cm$^2$ at a wavelength of about 400 nm or less. Heat curing may be performed at a temperature of about 40° C. to about 200° C. for about 1 hour to about 30 hours. Under these conditions, the composition for window films can be sufficiently cured. For example, heat curing may be performed after photocuring in order to achieve higher hardness of the coating layer.

Before curing the composition for window films coated onto the base layer 110, the method may further include drying the composition. When curing is performed after drying, it is possible to prevent increase in surface roughness of the coating layer due to photocuring or heat curing for a long period of time. Drying may be performed at about 40° C. to about 200° C. for about 1 minute to about 30 hours, without being limited thereto.

Next, a flexible window film according to another embodiment will be described with reference to FIG. 2. FIG. 2 is a sectional view of a flexible window film according to another embodiment of the invention.

Referring to FIG. 2, a flexible window film 200 according to another embodiment of the invention may include a base layer 110, a coating layer 120 formed on one surface of the base layer 110, and an adhesive layer 130 formed on the other surface of the base layer 110, in which the coating layer 120 may be formed of the composition for window films according to the embodiment of the present invention.

The adhesive layer 130 may futher formed on the other surface of the base layer 110 can facilitate adhesion between the flexible window film and a touchscreen panel, a polarizing plate or a display part. The flexible window film according to this embodiment is substantially the same as the flexible window film according to the above embodiment excluding the adhesive layer. Thus, the following description will focus on the adhesive layer 130.

The adhesive layer 130 attaches a polarizing plate, a touchscreen panel, or a display part to the flexible window film 200 to be disposed under the flexible window film 200, and may be formed of an adhesive composition for the adhesive layer. Specifically, the adhesive layer 130 may be formed of an adhesive composition including an adhesive resin such as a (meth)acrylic resin, a urethane resin, a silicone resin, and an epoxy resin, a curing agent, a photoinitiator, and a silane coupling agent.

The (meth)acrylic resin is a (meth)acrylic copolymer having an alkyl group, a hydroxyl group, an aromatic group, a carboxylic acid group, an alicyclic group, a hetero-alicyclic group, and the like, and may include a typical (meth)acrylic copolymer. Specifically, the (meth)acrylic resin may be formed of a monomer mixture including at least one of a (meth)acrylic monomer containing a $C_1$ to $C_{10}$ unsubstituted alkyl group, a (meth)acrylic monomer containing a $C_1$ to $C_{10}$ alkyl group having at least one hydroxyl group, a (meth)acrylic monomer containing a $C_6$ to $C_{20}$ aromatic group, a (meth)acrylic monomer containing a carboxylic acid group, a (meth)acrylic monomer containing a $C_3$ to $C_{20}$ alicyclic group, and a (meth)acrylic monomer containing a $C_3$ to $C_{10}$ hetero-alicyclic group having at least one of nitrogen (N), oxygen (O), and sulfur (S).

The curing agent is a polyfunctional (meth)acrylate and may include a bifunctional (meth)acrylate such as hexanediol diacrylate; a trifunctional (meth)acrylate such as trimethylolpropane tri(meth)acrylate; a tetra-functional (meth)acrylate such as pentaerythritol tetra(meth)acrylate; a pentafunctional (meth)acrylate such as dipentaerythritol penta (meth)acrylate; and a hexa-functional (meth)acrylate such as dipentaerythritol hexa(meth)acrylate, without being limited thereto.

The photoinitiator is a typical photoinitiator and may include the photo-radical initiator described above.

The silane coupling agent may include an epoxy group-containing silane coupling agent such as 3-glycidoxypropyltrimethoxysilane.

The adhesive composition may include 100 parts by weight of the (meth)acrylic resin, about 0.1 parts by weight to about 30 parts by weight of the curing agent, about 0.1 parts by weight to about 10 parts by weight of the photoinitiator, and about 0.1 parts by weight to about 20 parts by weight of the silane coupling agent. With this composition, the adhesive layer formed of the adhesive composition can sufficiently attach the flexible window film to the display part, the touchscreen panel, or the polarizing plate.

The adhesive layer 130 may have a thickness of about 10 μm to about 100 μm. Within this range of thickness, the adhesive layer can sufficiently attach the flexible window film to an optical device such as a polarizing plate.

Next, a flexible display according to one embodiment will be described with reference to FIG. 3 and FIG. 4. FIG. 3 is a sectional view of a flexible display according to one embodiment of the present invention and FIG. 4 is a sectional view of one embodiment of a display part shown in FIG. 3.

Referring to FIG. 3, a flexible display 300 according to one embodiment of the invention includes a display part 350a, an adhesive layer 360, a polarizing plate 370, a touchscreen panel 380, and a flexible window film 390, which may include the flexible window film 390 according to the embodiments of the invention.

The display part 350a serves to drive the flexible display 300 and may include a substrate and an optical device formed on the substrate and including an OLED, an LED or an LCD device. FIG. 4 is a sectional view of one embodiment of the display part shown in FIG. 3. Referring to FIG. 4, the display part 350a includes a lower substrate 310, a thin film transistor 316, an organic light emitting diode 315, a flattening layer 314, a protective layer 318, and an insulating layer 317.

The lower substrate 310 supports the display part 350a, and the thin film transistor 316 and the organic light emitting diode 315 may be formed on the lower substrate 310. The lower substrate 310 may be formed with a flexible printed circuit board (FPCB) for driving the touchscreen panel 380. The flexible printed circuit board may further include a timing controller, a power source, and the like in order to drive an array of organic light emitting diodes.

The lower substrate 310 may include a substrate formed of a flexible resin. Specifically, the lower substrate 310 may include a flexible substrate such as a silicone substrate, a polyimide substrate, a polycarbonate substrate, and a polyacrylate substrate, without being limited thereto.

In a display area of the lower substrate 310, plural pixel domains are defined by plural driving wires (not shown) and plural sensor wires (not shown) intersecting each other and each of the pixel domains may be formed with an array of organic light emitting diodes, each of which includes the thin film transistor 316 and the organic light emitting diode 315 connected to the thin film transistor 316. In a non-display area of the lower substrate, a gate driver applying electrical signals to the driving wires may be formed in the form of a gate-in panel. The gate-in panel circuit may be formed at one or both sides of the display area.

The thin film transistor 316 controls electric current flowing through a semiconductor by application of an electric field perpendicular to the electric current and may be formed on the lower substrate 310. The thin film transistor 316 may include a gate electrode 310a, a gate insulation layer 311, a semiconductor layer 312, a source electrode 313a, and a drain electrode 313b. The thin film transistor 316 may be an oxide thin film transistor which uses an oxide such as indium gallium zinc oxide (IGZO), ZnO, or TiO as the semiconductor layer, an organic thin film transistor which uses an organic material as the semiconductor layer, an amorphous silicon thin film transistor which uses amorphous silicon as the semiconductor layer, or a polycrystalline silicon thin film transistor which uses polycrystalline silicon as the semiconductor layer.

The flattening layer 314 covers the thin film transistor 316 and a circuit section 310b to flatten upper surfaces of the thin film transistor 316 and the circuit section 310b such that the organic light emitting diode 315 can be formed thereon. The flattening layer 314 may be formed of a spin-on-glass (SOG) film, a polyimide polymer, or a polyacrylic polymer, without being limited thereto.

The organic light emitting diode 315 realizes a display through self-emission, and may include a first electrode 315a, an organic light-emitting layer 315b, and a second electrode 315c, which are stacked in the stated order. Adjacent organic light emitting diodes may be isolated from each other by the insulating layer 317. The organic light emitting diode 315 may have a bottom emission type structure wherein light generated from the organic light-emitting layer 315b is emitted through the lower substrate, or a top-emission type structure wherein light from the organic light-emitting layer 315b is emitted through an upper substrate.

The protective layer 318 covers the organic light emitting diodes 315 to protect the organic light emitting diodes 315. The protective layer 318 may be formed of an inorganic material such as SiOx, SiNx, SiC, SiON, SiONC, and amorphous carbon (a-C), or an organic material such as (meth)acrylates, epoxy polymers, imide polymers, and the like. Specifically, the protective layer 318 may include an encapsulation layer in which an inorganic material layer and an organic material layer are sequentially stacked once or plural times.

Referring again to FIG. 3, the adhesive layer 360 attaches the display part 350a to the polarizing plate 370, and may be formed of an adhesive composition including a (meth)acrylate resin, a curing agent, an initiator, and a silane coupling agent.

The polarizing plate 370 can realize polarization of internal light or prevent reflection of external light to realize a display, or can increase contrast of the display. The polarizing plate may be composed of a polarizer alone. Alternatively, the polarizing plate may include a polarizer and a protective film formed on one or both surfaces thereof. Alternatively, the polarizing plate may include a polarizer and a protective coating layer formed on one or both surfaces thereof. As the polarizer, the protective film and the protective coating layer, a typical polarizer, a typical protective film and a typical protective coating layer known in the art may be used.

The touchscreen panel 380 generates electrical signals through detection of variation in capacitance when a human body or a conductor such as a stylus touches the touchscreen panel, and the display part 350a may be driven by such electrical signals. The touchscreen panel 380 is formed by patterning a flexible conductor, and may include first sensor electrodes and second sensor electrodes each formed between the first sensor electrodes and intersecting the first sensor electrodes. The touchscreen panel 380 may include a conductive material such as metal nanowires, conductive polymers, and carbon nanotubes, without being limited thereto.

The flexible window film 390 may be disposed as an outermost layer of the flexible display 300 to protect the flexible display.

Although not shown in FIG. 3, adhesive layers may be further formed between the polarizing plate 370 and the touchscreen panel 380 and/or between the touchscreen panel 380 and the flexible window film 390 to reinforce coupling between the polarizing plate, the touchscreen panel, and the flexible window film. The adhesive layers may be formed of an adhesive composition including a (meth)acrylate resin, a curing agent, an initiator, and a silane coupling agent. Although not shown in FIG. 3, a polarizing plate may be further disposed under the display part 350a to realize polarization of internal light.

Next, a flexible display according to another embodiment of the present invention will be described with reference to FIG. 5. FIG. 5 is a sectional view of a flexible display according to another embodiment of the present invention.

Referring to FIG. 5, a flexible display 400 according to another embodiment of the invention includes a display part 350a, a touchscreen panel 380, a polarizing plate 370, and a flexible window film 390, which may include the flexible window film 390 according to the embodiments of the invention. The flexible display according to this embodiment is substantially the same as the flexible display according to the above embodiment except that the touchscreen panel 380 is disposed under the polarizing plate 370 instead of being directly formed on the flexible window film 390. In addition, the touchscreen panel 380 may be formed together with the display part 350a. In this case, since the touchscreen panel 380 is formed together with the display part 350a on the display part 350a, the flexible display according to this embodiment is thinner and brighter than the flexible display according to the above embodiment, thereby providing better visibility. Furthermore, the touchscreen panel 380 may be formed by deposition, without being limited thereto. Although not shown in FIG. 5, adhesive layers may be further formed between the display part 350a and the touchscreen panel 380, between the touchscreen panel 380 and the polarizing plate 370, and/or between the polarizing plate 370 and the flexible window film 390 to reinforce mechanical strength of the display. The adhesive layers may be formed of an adhesive composition including a (meth) acrylate resin, a curing agent, an initiator, and a silane coupling agent. Although not shown in FIG. 5, a polarizing plate may be further disposed under the display part 350a to provide a good display image through polarization of internal light.

Next, a flexible display according to a further embodiment of the present invention will be described with reference to FIG. 6. FIG. 6 is a sectional view of a flexible display according to a further embodiment of the present invention. Referring to FIG. 6, a flexible display 500 according to a further embodiment of the invention includes a display part 350b, an adhesive layer 360, and a flexible window film 390, which may include the flexible window film 390 according to the embodiments of the invention. The flexible display according to this embodiment is substantially the same as the flexible display according to the one embodiment except that the flexible display can be driven by the display part 350b alone and the polarizing plate and the touchscreen panel are omitted.

The display part 350b may include a substrate and an optical device formed on the substrate and including an OLED, an LED or an LCD device. The display part 350b may further include a touchscreen panel therein.

Although the flexible window films according to the embodiments of the invention are described as being applied to a flexible display, it should be understood that the flexible window films according to the embodiments of the present invention may also be applied to a non-flexible display.

Hereinafter, the present invention will be described in more detail with reference to some examples. It should be understood that these examples are provided for illustration only and are not to be construed in any way as limiting the present invention.

EXAMPLE 1

150 g of a silicone monomer mixture including 97 mol % of 2-(3,4-epoxycyclohexyl)ethyltriethoxysilane (Shin-Etsu Chemical Co., Ltd.) and 3 mol % of dimethyldimethoxysilane (Sigma-Aldrich) was placed in a 500 ml 3-neck flask. Then, relative to the amount of the monomer mixture, 1 mol % of KOH and 1.6 mol % of water were added to the monomer mixture, followed by stirring at 65° C. for 2 hours. Thereafter, methanol was removed from the resulting material by distillation, followed by washing the resulting material with water, and the remaining solvent was removed using a vacuum distillation device, thereby preparing a siloxane resin (weight average molecular weight: 5,500, as measured by gel permeation chromatography (GPC), (EcSiO$_{3/2}$)$_{0.97}$((Me)$_2$SiO$_{2/2}$)$_{0.03}$).

A composition for window films was prepared by mixing 100 parts by weight of the siloxane resin, 10 parts by weight of a crosslinking agent (bis(3,4-epoxycyclohexylmethyl) adipate), and 3 parts by weight of an initiator (Irgacure-250, BASF). The prepared composition for window films was coated onto a 50 μm thick polyimide film by bar coating and dried at 100° C. for 4 minutes, followed by UV irradiation at 1,000 mJ/cm$^2$, thereby preparing a window film having a 50 μm thick coating layer.

EXAMPLES 2 to 4

Each of window films was prepared in the same manner as in Example 1 except that a silicone monomer mixture was changed as listed in Table 1.

COMPARATIVE EXAMPLE 1

A window film was prepared in the same manner as in Example 1 except that 100 mol % of 2-(3,4-epoxycyclohexyl)ethyltriethoxysilane was used.

COMPARATIVE EXAMPLE 2

A window film was prepared in the same manner as in Example 1 except that a silicone monomer mixture was prepared by mixing 70 mol % of 2-(3,4-epoxycyclohexyl) ethyltriethoxysilane and 30 mol % of dimethyldimethoxysilane.

COMPARATIVE EXAMPLE 3

A window film was prepared in the same manner as in Example 1 except that a silicone monomer mixture was prepared by mixing 60 mol % of 2-(3,4-epoxycyclohexyl) ethyltriethoxysilane and 40 mol % of dimethyldimethoxysilane.

COMPARATIVE EXAMPLE 4

150 g of a monomer mixture including 90 mol % of 2-(3,4-epoxycyclohexyl)ethyltriethoxysilane (Shin-Etsu Chemical Co., Ltd.) and 10 mol % of octylmethyldimethoxysilane (Sigma-Aldrich) was placed in a 500 ml 3-neck flask. Then, relative to the amount of the monomer mixture, 1 mol % of KOH and 1.6 mol % of water were added to the monomer mixture, followed by stirring at 65° C. for 2 hours. Thereafter, methanol was removed from the resulting material by distillation, followed by washing the resulting material with water, and the remaining solvent was removed using a vacuum distillation device, thereby preparing a siloxane resin (weight average molecular weight: 5,000, as measured by gel permeation chromatography (GPC). A window film was prepared using the prepared siloxane resin in the same manner as in Example 1.

COMPARATIVE EXAMPLE 5

150 g of a monomer mixture including 90 mol % of 2-(3,4-epoxycyclohexyl)ethyltriethoxysilane (Shin-Etsu Chemical Co., Ltd.) and 10 mol % of cyclohexylmethyldimethoxysilane (Gelest) was placed in a 500 ml 3-neck flask. Then, relative to the amount of the monomer mixture, 1 mol % of KOH and 1.6 mol % of water were added to the monomer mixture, followed by stirring at 65° C. for 2 hours. Thereafter, methanol was removed from the resulting material by distillation, followed by washing the resulting material with water, and the remaining solvent was removed using a vacuum distillation device, thereby preparing a siloxane resin (weight average molecular weight: 3,500, as measured by gel permeation chromatography (GPC). A window film was prepared using the prepared siloxane resin in the same manner as in Example 1.

Details of the compositions for window films used in Examples and Comparative Examples are shown in Table 1.

The window films prepared in Examples and Comparative Examples were evaluated as to Properties (1) to (4) and evaluation results are shown in Table 1.

(1) Pencil hardness: Pencil hardness was measured on a coating layer of a window film using a pencil hardness tester (Heidon) in accordance with JIS K5400. Pencil hardness was measured using pencils of 6B to 9H (Mitsubishi Co., Ltd.) under conditions of a pencil load of 1 kg on the coating layer, a scratch angle of 45°, and a scratch speed of 60 mm/min. When the coating layer had one or more scratches after being tested 5 times using a certain pencil, pencil hardness was measured again using another pencil having one-level lower pencil hardness than the previous pencil. A pencil hardness value allowing no scratch to be observed all five times on the coating layer was taken as pencil hardness of the coating layer.

(2) Radius of curvature: A window film (width×length×thickness, 3 cm×15 cm×100 μm, base layer thickness: 50 μm, coating layer thickness: 50 μm) was wound around a jig for measuring radius of curvature, kept wound for 5 seconds or more, unwound, and then observed with the naked eye to determine whether the window film had cracks. Here, the radius of curvature was measured by winding the window film around the jig such that the coating layer of the window film contacted the jig to compression direction, and was determined by a minimum radius of a jig causing no cracks on the window film, as measured while gradually decreasing the diameters of jigs from a jig having the maximum diameter.

(3) Curling: Referring to FIG. 7, a rectangular window film 1 (length×width×thickness: 10 cm×10 cm×100 μm, base layer thickness: 50 μm, coating layer thickness: 50 μm) was placed on a floor surface 2 and left at 25° C. and 40% RH. Here, a curl length was obtained by measuring heights H from the floor surface 2 to an each edges of the window film 1 three times, followed by averaging.

(4) Appearance: Generation of orange peel, wave patterns and wrinkles on a coating layer of a window film were observed with the naked eye. Generation of the wave patterns was determined based on the presence of an irregular shadow on a black sheet when the coating layer of the window film placed 10 cm above the black sheet was irradiated with light. Generation of no wave patterns, no orange peel such as an orange surface and no wrinkles was evaluated as '3', generation of one or two defects among the orange peel, wave patterns and wrinkles was evaluated as '2', and generation of all of these defects was evaluated as '1'. A window film having an appearance value of '2' or '1' cannot be used in a display device.

TABLE 1

|  |  | Example | | | | Comparative Example | | | | |
| --- | --- | --- | --- | --- | --- | --- | --- | --- | --- | --- |
|  |  | 1 | 2 | 3 | 4 | 1 | 2 | 3 | 4 | 5 |
| Silicone monomer (mol %) | 2-(3,4-epoxycyclohexyl)ethyltriethoxysilane | 97 | 95 | 90 | 80 | 100 | 70 | 60 | 90 | 90 |
|  | dimethyldimethoxysilane | 3 | 5 | 10 | 20 | — | 30 | 40 | — | — |
|  | octylmethyldimethoxysilane | — | — | — | — | — | — | — | 10 | — |
|  | cyclohexylmethyldimethoxysilane | — | — | — | — | — | — | — | — | 10 |
|  | x and y in Formula 1 | x = 0.97, y = 0.03 | x = 0.95, y = 0.05 | x = 0.90, y = 0.10 | x = 0.80, y = 0.20 | x = 1.0, y = 0 | x = 0.70, y = 0.30 | x = 0.60, y = 0.40 | — | — |
|  | Crosslinking agent (parts by weight) | 10 | 10 | 10 | 10 | 10 | 10 | 10 | 10 | 10 |
|  | Initiator (parts by weight) | 3 | 3 | 3 | 3 | 3 | 3 | 3 | 3 | 3 |
|  | Pencil hardness | 8H | 8H | 8H | 8H | 8H | 6H | 5H | 2H | 4H |
|  | Radius of curvature (mm) | 3 | 3 | 2 | 1 | 5 | 1 | 1 | 1 | 1 |
|  | Curling (mm) | 5 | 5 | 3 | 1 | 15 | 0 | 0 | 0 | 5 |
|  | Appearance | 3 | 3 | 3 | 3 | 2 | 1 | 1 | 1 | 1 |

As shown in Table 1, each of the flexible window films of Examples had a high pencil hardness of 8H or more and a radius of curvature of 3.0 mm or less to provide good flexibility, and could suppress curling.

Conversely, as shown in Table 1, each of the flexible window films of Comparative Examples 1 to 3, which were prepared using compositions each including a siloxane resin containing the $(R^2R^3SiO_{2/2})$ outside the range according to the present invention, exhibited poor properties in terms of curling, external appearance or hardness. In addition, the flexible window film of Comparative Example 4 or 5, which was prepared using a composition including a siloxane resin having a D unit containing an octyl group or a cyclohexyl group, had poor hardness and poor appearance due to poor coatability of the composition.

It should be understood that various modifications, changes, alterations, and equivalent embodiments can be made by those skilled in the art without departing from the spirit and scope of the invention.

The invention claimed is:

1. A composition for window films, including: a siloxane resin including a compound represented by Formula 1; a crosslinking agent; and an initiator:

$$(R^1SiO_{3/2})_x(R^2R^3SiO_{2/2})_y \qquad \text{<Formula 1>}$$

(where in Formula 1, $R^1$ is an epoxy group; $R^2$ and $R^3$ are each independently a methyl group or an ethyl group; and $0.75 \leq x < 1$, $0 < y \leq 0.25$, and $x+y=1$).

2. The composition for window films according to claim 1, wherein the siloxane resin includes at least one of compounds represented by Formulae 1-1 to 1-3:

$$(EcSiO_{3/2})_x((Me)_2SiO_{2/2})_y \qquad \text{<Formula 1-1>}$$

$$(EcSiO_{3/2})_x((Et)_2SiO_{2/2})_y \qquad \text{<Formula 1-2>}$$

$$(EcSiO_{3/2})_x(MeEtSiO_{2/2})_y \qquad \text{<Formula 1-3>}$$

(where in Formulae 1-1 to Formulae 1-3, Ec is a (3,4-epoxycyclohexyl)ethyl group, Me is a methyl group, and Et is an ethyl group; and $0.75 \leq x < 1$, $0 < y 0.25$, and $x+y=1$).

3. The composition for window films according to claim 1, wherein the crosslinking agent includes at least one of a non-cyclic aliphatic epoxy monomer, a cyclic aliphatic epoxy monomer, an aromatic epoxy monomer, a hydrogenated aromatic epoxy monomer, and an oxetane monomer.

4. A flexible window film including a base layer and a coating layer formed on one surface of the base layer, wherein the coating layer is formed of the composition for window films according to claim 1.

5. The flexible window film according to claim 4, wherein the base layer includes a polyimide film.

6. The flexible window film according to claim 4, wherein the coating layer has a thickness of about 40 μm to about 60 μm.

7. The flexible window film according to claim 4, further including: an adhesive layer formed on the other surface of the base layer.

8. The flexible window film according to claim 4, wherein the flexible window film has a radius of curvature of about 3 mm or less and a pencil hardness of about 8H or higher.

9. A flexible display including the flexible window film according to claim 4.

10. The flexible display according to claim 9, including: a display part; an adhesive layer formed on the display part; a polarizing plate formed on the adhesive layer; a touchscreen panel formed on the polarizing plate; and the flexible window film formed on the touchscreen panel.

11. The flexible display according to claim 9, including: a display part; a touchscreen panel formed on the display part; a polarizing plate formed on the touchscreen panel; and the flexible window film formed on the polarizing plate.

12. The flexible display according to claim 9, including: a display part; an adhesive layer formed on the display part; and the flexible window film formed on the adhesive layer.

13. The flexible display according to claim 12, further including: a polarizing plate disposed at an upper or lower side of the display part.

* * * * *